(12) United States Patent
Lin et al.

(10) Patent No.: US 11,139,636 B2
(45) Date of Patent: Oct. 5, 2021

(54) ELECTRICALLY PUMPED PHOTONIC-CRYSTAL SURFACE-EMITTING LASERS WITH OPTICAL DETECTOR

(71) Applicant: CONARY ENTERPRISE CO., LTD., Taipei (TW)

(72) Inventors: Kuo-Jui Lin, Taipei (TW); Yu-Chen Chen, Taipei (TW)

(73) Assignee: Conary Enterprise Co., Ltd., Taipei (TW)

(*) Notice: Subject to any disclaimer, the term of this patent is extended or adjusted under 35 U.S.C. 154(b) by 34 days.

(21) Appl. No.: 16/697,812

(22) Filed: Nov. 27, 2019

(65) Prior Publication Data
US 2021/0006039 A1 Jan. 7, 2021

(30) Foreign Application Priority Data
Jul. 2, 2019 (TW) ................. 108208604

(51) Int. Cl.
| *H01S 5/183* | (2006.01) |
| *H01S 5/11*  | (2021.01) |
| *H01S 5/026* | (2006.01) |
| *H01S 5/042* | (2006.01) |
| H01S 5/32    | (2006.01) |

(52) U.S. Cl.
CPC .......... *H01S 5/18319* (2013.01); *H01S 5/026* (2013.01); *H01S 5/04253* (2019.08); *H01S 5/11* (2021.01); *H01S 5/18308* (2013.01); H01S 5/3216 (2013.01)

(58) Field of Classification Search
CPC .. H01S 5/18319; H01S 5/026; H01S 5/18308; H01S 5/04253; H01S 5/11; H01S 5/3216
See application file for complete search history.

(56) References Cited

U.S. PATENT DOCUMENTS

| 2012/0072931 A1* | 3/2012 | Imada ................. G11B 5/6005 720/672 |
| 2019/0067900 A1* | 2/2019 | Bhattacharya ............................. H01L 31/035236 |
| 2019/0252855 A1* | 8/2019 | Lu ........................ H01S 5/3215 |

* cited by examiner

*Primary Examiner* — Yuanda Zhang
(74) *Attorney, Agent, or Firm* — Rosenberg, Klein & Lee

(57) ABSTRACT

An electrically pumped photonic-crystal surface-emitting lasers with optical detector comprises plurality of air holes, by the variation of position and size proportion form a photonic crystal having main structure and sub structure, and produces an optical detection signal by light guiding proportion of the light guiding tunnel, further have power proportion of the laser by reading the strength of the optical detection signal, so the automatic power control circuit can feedback the power proportion for controlling the surface-emitting laser.

14 Claims, 14 Drawing Sheets

ELECTRICALLY PUMPED PHOTONIC-CRYSTAL SURFACE-EMITTING LASERS WITH OPTICAL DETECTOR

BACKGROUND OF THE INVENTION

1. Field of the Invention

The invention relates to an electrically pumped photonic-crystal surface-emitting lasers with optical detector, the photonic crystal structure produces the light guiding tunnel to the optical detector, and the optical detector can detect the light guiding proportion of lasers in the light guiding tunnel, so we can know the power proportion of the photonic-crystal surface-emitting lasers.

2. Description of the Related Art

As FIG. 1A and FIG. 1B showing, a general automatic power control (APC) laser module 40 having a reflector 42 arranged slantingly in front of an laser diodes 41, the reflector 42 can be went through by the laser and reflects a part of laser, arranged a photodiode 43 in the laser reflection path, the photodiode 43 give power feedback to the automatic power control circuit 44 of the laser diodes 41, so as to maintain the stability of the output power of the laser; however, the laser diodes 41, the reflector 42, and the photodiode 43 is encapsulated by using an encapsulating case 45 having a lens 451 arranged at the front, the length of the encapsulating case 45 is increased for arranging the reflector 42, and the adjustment of the reflecting angle of the reflector 42 is time-consuming.

As FIG. 2 showing, the Taiwan patent No. 1303505 disclose a surface-emitting laser 50 comprising: a n type dopant gallium arsenide (GaAs) substrate 51, a first n type dopant mirror structure 52 formed on the GaAs substrate 51; a bottom cladding layer 53 deposit at the first n type mirror structure 52; an active layer 54 formed on the bottom cladding layer 53; a top cladding layer 55 formed on the active layer 54; a second n type mirror structure 56 formed on the top cladding layer 55, on the second n type mirror structure 56 formed a p type electrode 57, and at the bottom of the substrate 51 formed a n type electrode 58; however, the surface-emitting laser 50 cannot control the power proportion of the laser automatically.

Since the automatic power control laser module and the surface-emitting laser cannot be integrated, thus for solving the above-mentioned problems the inventor is using photonic crystal (PC) in the invention.

SUMMARY OF THE INVENTION

It is a primary objective of the present invention to provide an electrically pumped photonic-crystal surface-emitting lasers with optical detector that has an epitaxy structure etched toward the inside from the top to fabricate a photonic crystal, the photonic crystal structure produces the light guiding tunnel to the optical detector, and the optical detector can detect the light guiding proportion of lasers in the light guiding tunnel, so we can know the power proportion of the photonic-crystal surface-emitting lasers.

It is another objective of the present invention to provide an electrically pumped photonic-crystal surface-emitting lasers with optical detector that using the optical detection signal produced by the optical detector, then the automatic power control circuit can feedback the power proportion for controlling the surface-emitting laser.

In order to achieve the above objectives, the present invention comprising: An electrically pumped photonic-crystal surface-emitting lasers with optical detector, comprising: a substrate having a top surface and a bottom surface; a first cladding layer arranged on the top surface of the substrate; an active layer with a quantum structure arranged on the first cladding layer; a second cladding layer arranged on the active layer; a contact layer arranged on the second cladding layer in a shape of the mesa and including a plurality of air holes, by the variation of position and size proportion of the air holes to form a photonic crystal structure having main structure and substructure, and the main structure further having a first area on a top surface of the main structure and having a light guiding tunnel on the substructure; an electrical current confining structure arranged on the photonic crystal structure and on the active layer and including an opening corresponding to the first area on the photonic crystal structure, so as to confine the electrical currents within the first area; a transparent conducting layer arranged on the electrical currents confining structure and including a second area on a top surface thereof, covering the active layer of the photonic crystal structure and having the second area vertically aligned with the first area; a first metal electrode arranged on the transparent conducting layer with an aperture aligned with the second area of the transparent conducting layer to avoid blocking the first area; a second metal electrode arranged under the bottom surface of the substrate; and an optical detector arranged by the side of the light guiding tunnel of the substructure; whereby the first metal electrode, the transparent conducting layer, the electrical currents confining structure and the second metal electrode are arranged correspondingly for electrically pumping the quantum structure, and then the photonic crystal structure surface-emits laser through the first area of the main structure, the first opening of the electrical currents confining structure and the second area of the transparent conducting layer to the aperture of the first metal electrode, and the surface-emitting laser emits non surface-emitting laser along the light guiding tunnel of the substructure to the optical detector in the active layer, so the optical detector can detect the light guiding proportion of the laser in the light guiding tunnel and produce an optical detection signal.

In a preferred embodiment, further comprises an automatic power control circuit electrically connected to the optical detector, the first metal electrode, and the second metal electrode, and using the optical detection signal produced by the optical detector, the automatic power control circuit can feedback the power proportion for controlling the surface-emitting laser.

In a preferred embodiment, the optical detector includes the substrate, the first cladding layer, the active layer, the second cladding layer, the contact layer, the electric currents confining structure, a third metal electrode, and a fourth metal electrode, and the predetermination of the second cladding layer and the contact layer does not have plurality of air holes, and the electric currents confining structure has a second opening corresponding to the predetermination, the third metal electrode is arranged on the second opening and covering the contact layer, and the fourth metal electrode is arranged on the bottom surface of the substrate.

In a preferred embodiment, the second cladding layer has a thickness between 10 to 500 nm.

In a preferred embodiment, the electrical currents confining structure is made of a material selected from a group consisting of silicon nitride (SiNx), silicon oxide (SiOx) and polyimide.

In a preferred embodiment, the transparent conducting layer is made of a material selected from a group consisting of indium tin oxide (ITO), antimony tin oxide (ATO), fluorine doped tin oxide (FTO), aluminum zinc oxide (AZO), gallium zinc oxide (GZO), indium zinc oxide (IZO) and zinc oxide (ZnO).

In a preferred embodiment, the quantum structure includes at least a layer of quantum dots.

In a preferred embodiment, the layer of quantum dots is made of a material selected from a group consisting of indium arsenide phosphide (InAsP), gallium nitride (GaN), indium gallium arsenide (InGaAs), indium gallium nitride (InGaN), indium gallium phosphide (InGaP), aluminum gallium indium arsenide (AlGaInAs), aluminum gallium indium phosphide (AlGaInP) and gallium indium arsenide phosphide (GaInAsP).

In a preferred embodiment, the quantum structure includes at least a layer of quantum well.

In a preferred embodiment, the layer of quantum well is made of a material selected from a group consisting of InAsP, GaN, InGaAs, InGaN, InGaP, AlGaInAs, AlGaInP and GaInAsP.

In a preferred embodiment, the present invention further includes a buffer layer between the substrate and the first cladding layer.

In a preferred embodiment, the present invention further includes a first graded-index layer between the buffer layer and the first cladding layer.

In a preferred embodiment, the present invention further includes a first separate confinement heterostructure between the first cladding layer and the active layer and a second separate confinement heterostructure between the active layer and the second cladding layer.

In a preferred embodiment, the present invention further includes a second graded-index layer between the second cladding layer and the contact layer.

With structures disclosed above, the optical detector detects the light guiding proportion of the light guiding tunnel of the substructure to produce an optical detection signal, so we can know the power proportion of the photonic-crystal surface-emitting lasers, by integrating the optical detection signal produced by the optical detector, the automatic power control circuit can feedback the power proportion for controlling the surface-emitting laser.

DETAILED DESCRIPTION OF THE PREFERRED EMBODIMENT

Figure 1A:
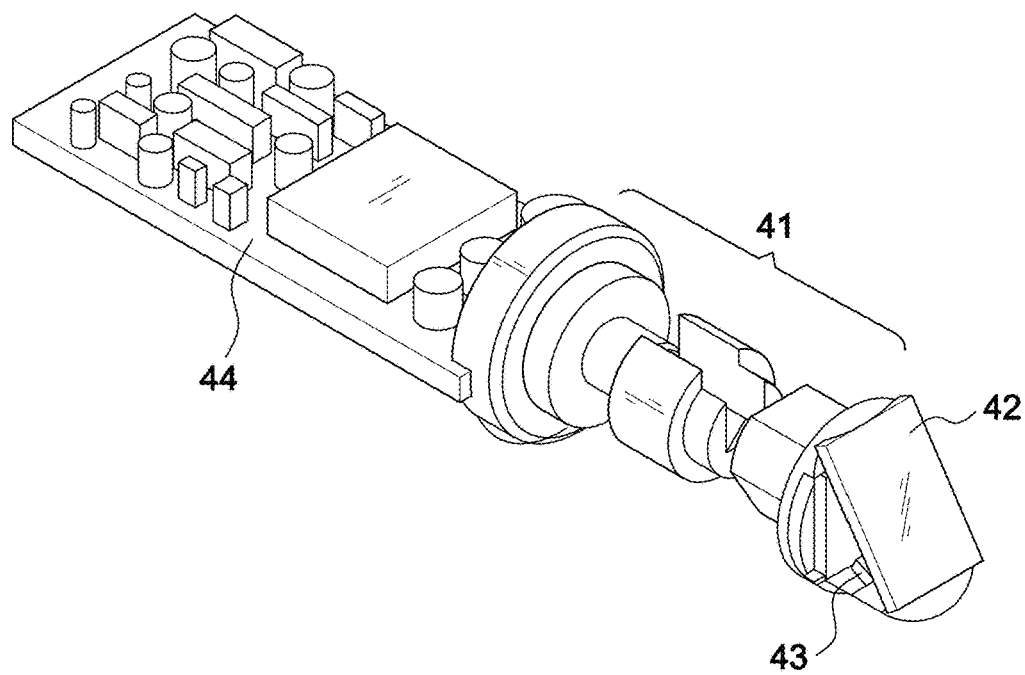
FIG. 1A is a schematic diagram illustrating automatic power control laser module in the prior art.
Figure 1B:
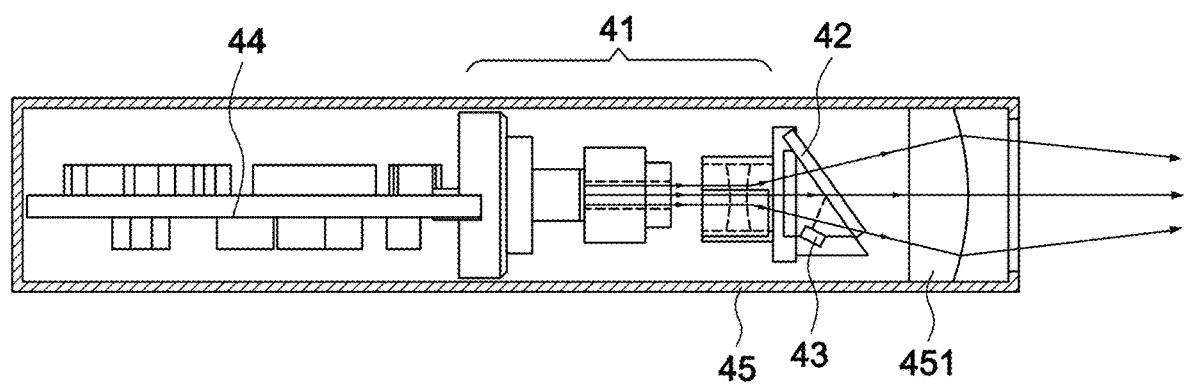
FIG. 1B is a sectional view of the automatic power control laser module in the prior art.
Figure 2:
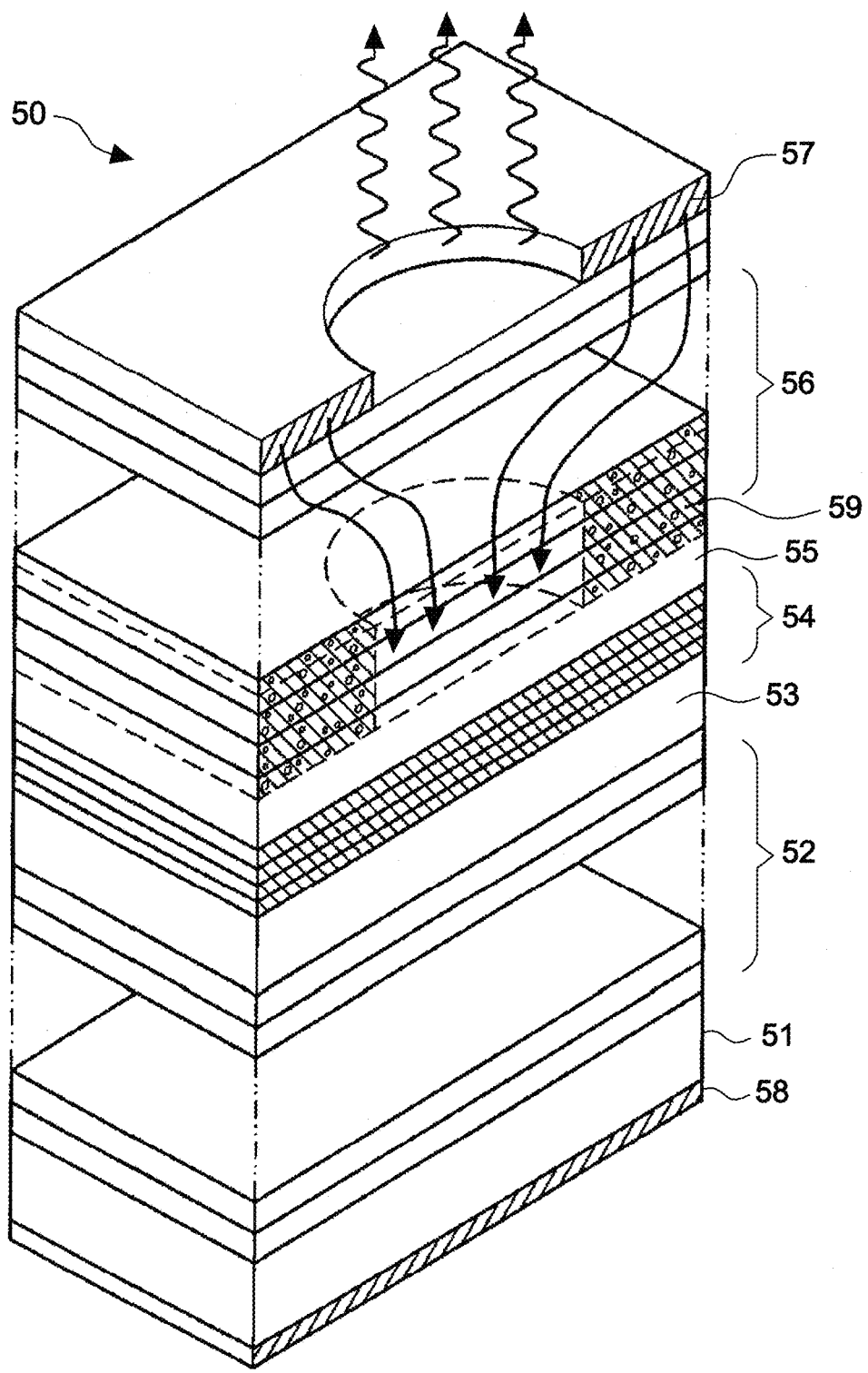
FIG. 2 is a schematic diagram illustrating surface-emitting laser of the prior art.

Referring to FIGS. 3A-3M, in a preferred embodiment, the present invention mainly includes an electrically pumped photonic-crystal surface-emitting lasers with optical detector, it is extended from the previous U.S. patent application Ser. No. 16/008,223 about an electronically pumped surface-emitting photonic crystal laser, comprising:

A substrate 11 having a top surface 111 and a bottom surface 112. In this embodiment, the substrate 11 is made of a material selected from a group consisting of gallium nitride (GaN), gallium arsenide (GaAs) and indium phosphide (InP), but it is not limited to such composition.

A first cladding layer 12 is arranged on the top surface 111 of the substrate 11. In this embodiment, the first cladding layer 12 is made of a material selected from a group consisting of aluminum gallium arsenide (AlGaAs), GaAs, aluminum gallium nitride (AlGaN), aluminum gallium indium arsenide (AlGaInAs) and aluminum gallium indium phosphide (AlGaInP), but it is not limited to such composition.

An active layer 13 is arranged on the first cladding layer 12 and has a quantum structure 131.

A second cladding layer 14 is arranged on the active layer 13. In this embodiment, the second cladding layer 14 has a thickness between 10 to 500 nm and is made of a material selected from a group consisting of AlGaAs, GaAs, AlGaN, AlGaInAs and AlGaInP, but it is not limited to such composition.

A contact layer C is arranged on the second cladding layer 14. In the embodiment, the contact layer C is made of a material selected from a group consisting of GaN, GaAs and indium gallium arsenide phosphide (InGaAsP), but it is not limited to such composition.

Figure 3A:
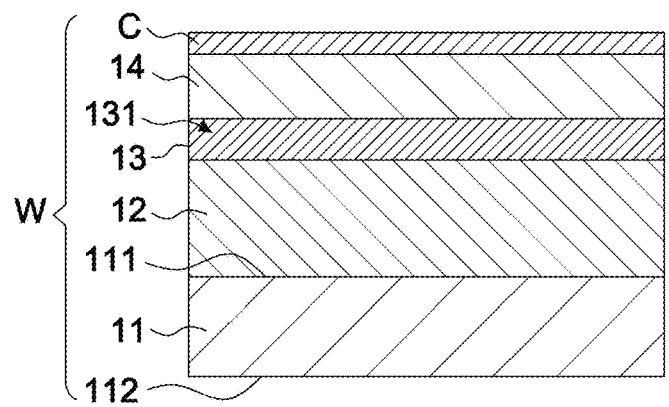
FIG. 3A is a schematic diagram of an epitaxy structure of the present invention.
Figure 3B:
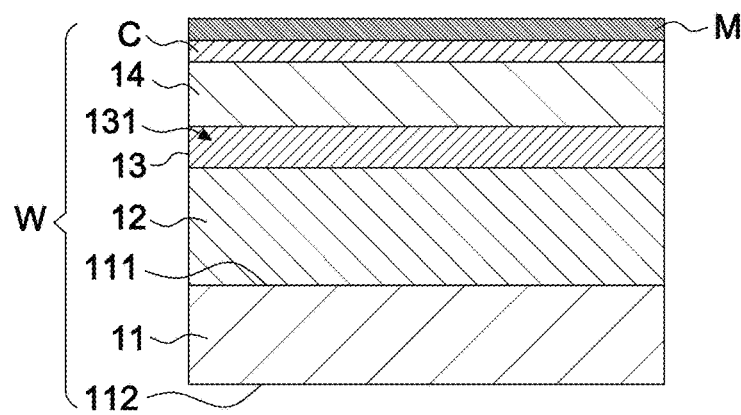
FIG. 3B is a schematic diagram illustrating fabrication of a hard mask of the present invention.
Figure 3C:
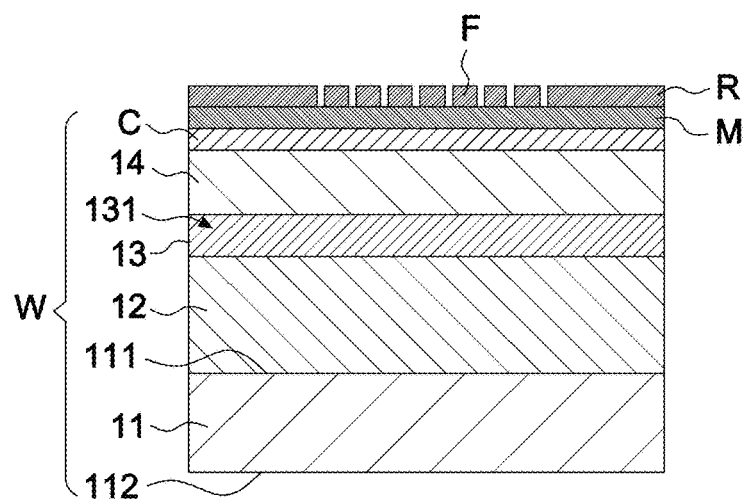
FIG. 3C is a schematic diagram illustrating a geometric pattern formed on the hard mask of the present invention.
Figure 3D:
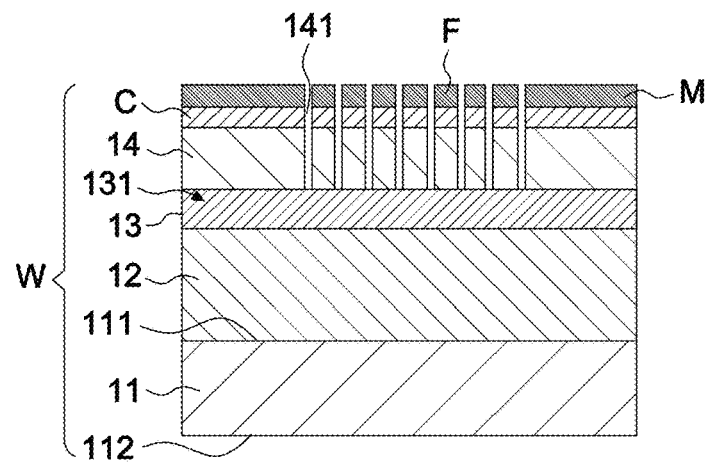
FIG. 3D is a schematic diagram illustrating the present invention imprinting of the geometric pattern.
Figure 3E:
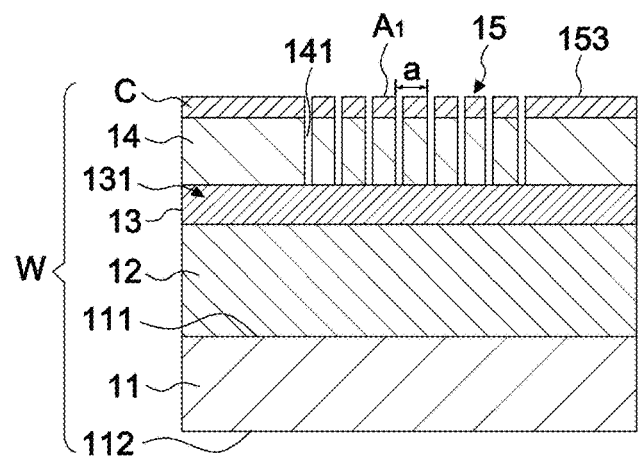
FIG. 3E is a schematic diagram illustrating the hard mask of the present invention being removed.

With reference to FIG. 3A, the substrate 11, the first cladding layer 12, the active layer 13, the second cladding layer 14 and the contact layer C fabricated an epitaxy structure W, but the layers of the epitaxy structure W is not limited. Further with reference to FIG. 3B, the hard mask M is fabricated by having silicon nitride (SiNx) deposited on the epitaxy structure W, but the present invention is not limited to such application. With reference to FIG. 3C, a geometric pattern F is formed by having positive photoresist R applied on the epitaxy structure W within a square area of 290 µm; but the present invention is not limited to such application. FIG. 3D illustrated the imprint of the geometric pattern F. The geometric pattern F is imprinted onto the hard mask M and then the positive photoresist R is removed; then the geometric pattern F is further imprinted onto the epitaxy structure W. Since a waveguide pattern of the quantum structure 131 mostly restricts the laser within the active layer 13, deep etching is required for better bonding. When the depth of etching is greater than 500 nm, the bonding efficiency of the photonic crystals is better, but the present invention is not limited to such application. FIG. 3E further illustrated removal of the hard mask M.

Figure 3F:
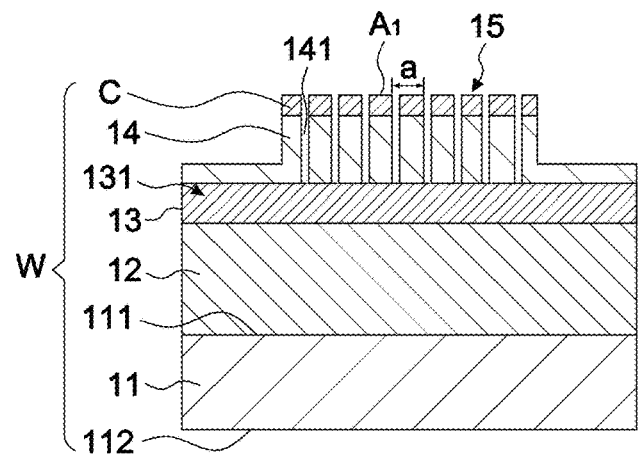
FIG. 3F is a schematic diagram illustrating the present invention forming a mesa by etching.
Figure 3G:
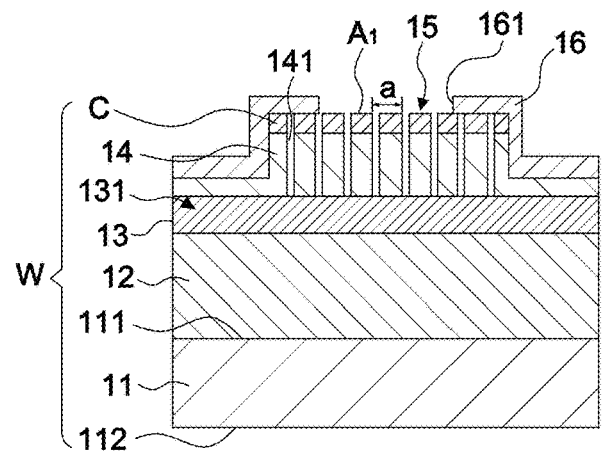
FIG. 3G is a schematic diagram illustrating fabrication of an electrical currents confining structure of the present invention.
Figure 3H:
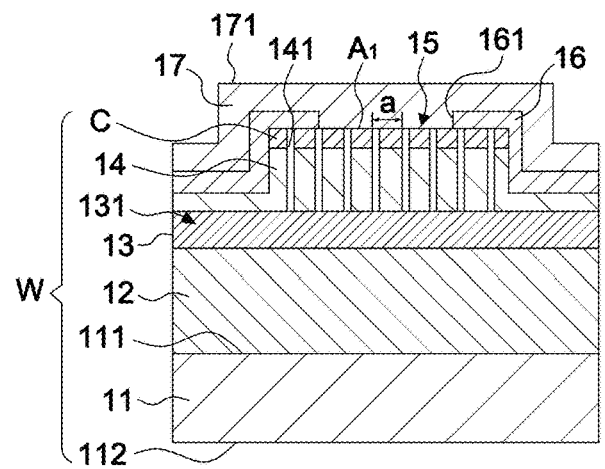
FIG. 3H is a schematic diagram illustrating fabrication of a transparent conducting layer of the present invention.
Figure 3I:
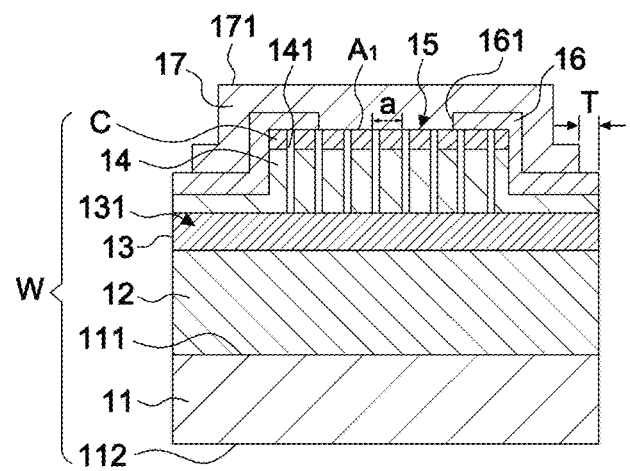
FIG. 3I is a schematic diagram illustrating a plurality of trenches regarded as boundaries of isolation on the present invention.
Figure 3J:
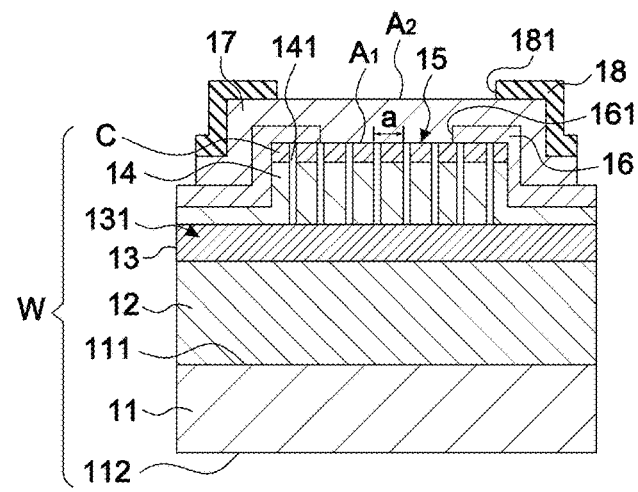
FIG. 3J is a schematic diagram illustrating the thickness of a substrate of the present invention being reduced.
Figure 3K:
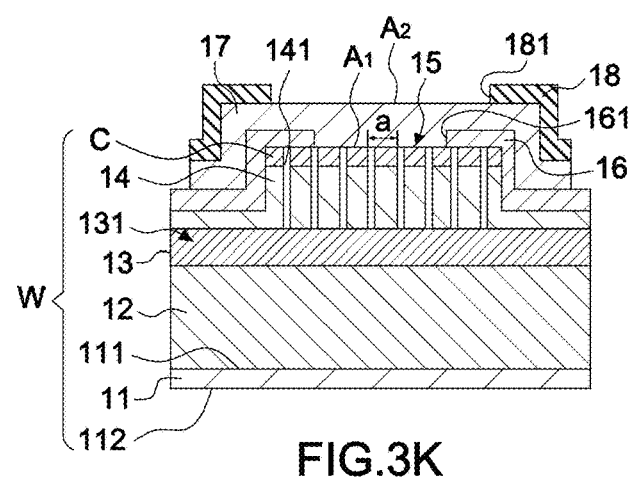
FIG. 3K is a schematic diagram illustrating deposition of first metal electrode of the present invention.
Figure 3L:
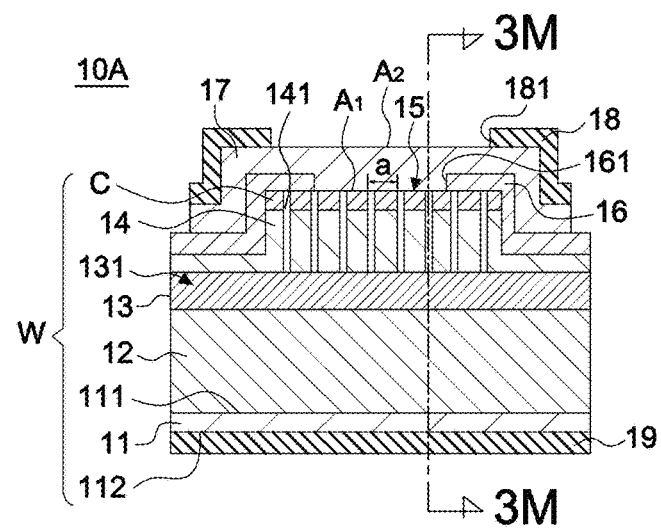
FIG. 3L is a schematic diagram illustrating deposition of second metal electrode of the present invention.
Figure 3M:
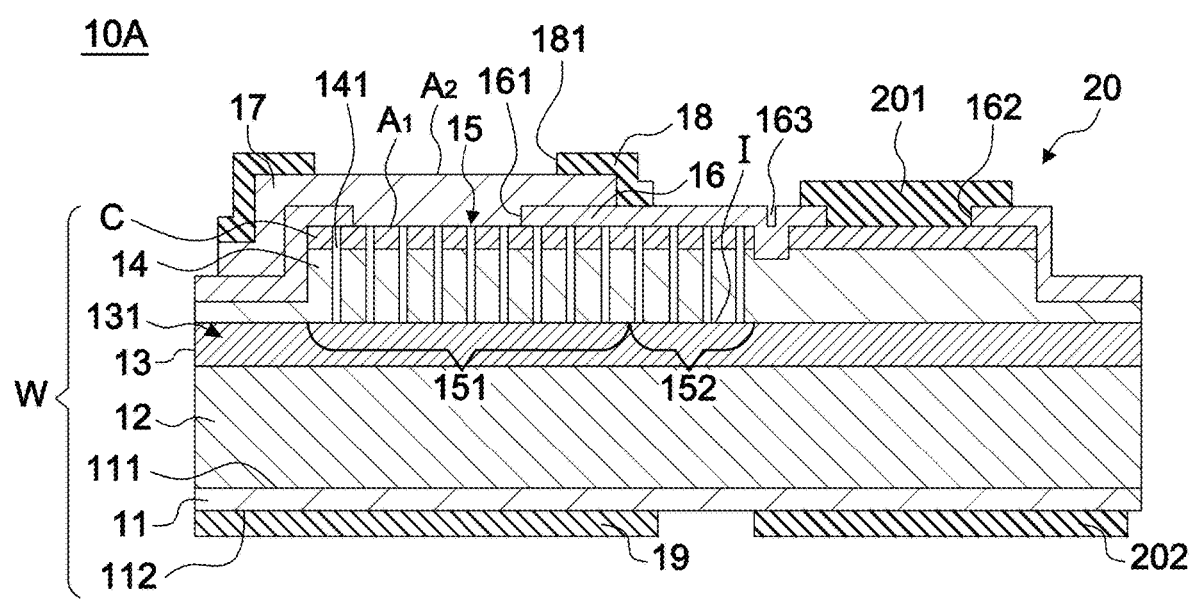
FIG. 3M is a sectional view along line 3M-3M in FIG. 3L.
Figure 4A:
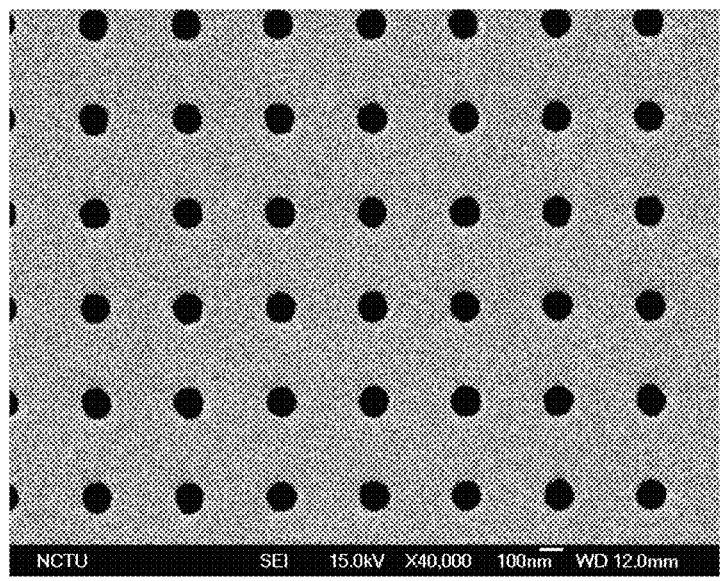
FIG. 4A is a top plan view of plurality of air holes of the main structure under an electron microscope.
Figure 4B:
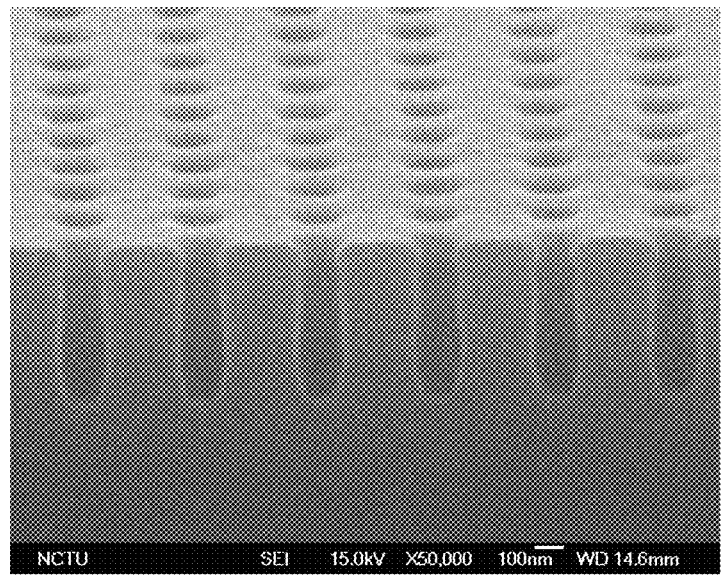
FIG. 4B is a side view of plurality of air holes of the main structure under an electron microscope.

With reference to FIG. 3F and FIG. 3M, a square mesa of 310 µm on the second cladding layer 14 and the contact layer C is fabricated by photolithography with an etching depth of 450 nm. The mesa further includes a plurality of air holes 141 to form the main structure 151 and substructure 152 with a plurality of first areas A1 on a top surface 153 of the main structure 151. The purpose of the mesa is to limit the laser beams within the photonic crystals and reduce leakage currents. In this embodiment, the periodicity a of the main structure 151 is 385 nm, 388 nm, 390 nm, 393 nm or 395 nm, but the present invention is not limited to such application. Additionally, the air holes 141 of the mesa as shown in FIGS. 4A and 4B are arranged in a column shape with a depth of 520-540 nm and a diameter of 130-140 nm, and the air holes 141 are arranged in 2-dimension, but the present invention is not limited to such application.

FIG. 3G and FIG. 3M illustrated the fabrication of the electric currents confining structure 16. Since photonic crystals have infinite periodicity, theoretically, there would not be loss on boundaries; however, the photonic crystals for application actually have finite periodicity, so there would be loss on boundaries during operation. Therefore, to reduce the loss on boundaries during operation, an area of the photonic crystals is arranged to be greater than a gain area of the device; additionally, the photonic crystals having an area 2-3 times greater than a gain area of the device can still produce laser beams successfully. Consequently, photolithography is applied to the present invention to fabricate a geometric pattern of an opening 161 in the middle of the first areas A1 of the main structure 151 with a diameter of 150 µm; then SiNx is deposited with a thickness of 120 nm. After removing unnecessary SiNx by lift-off process, the first opening 161 is fabricated correspondingly to the first areas A1 to confine electrical currents within the first areas A1 and to enable the laser pattern to exist within the main structure 151 similar to one with infinite periodicity. In this embodiment, the electrical currents confining structure 16 is made of a material selected from a group consisting of SiNx, silicon oxide (SiOx) and polyimide, but the present invention is not limited to such application.

FIG. 3H and FIG. 3M illustrated the fabrication of the transparent conducting layer 17. Since the present invention is a surface-emitting laser, covering a great area of metal around the area for emission would affect the emission. Therefore, indium tin oxide (ITO) is selected for fabrication of the transparent conducting layer 17 due to its transmission property. The transparent conducting layer 17 is formed by having ITO fabricated with a thickness of 225 nm by an e-gun evaporator. The transparent conducting layer 17 is arranged on the electrical currents confining structure 16 and covering the first areas A1 of the main structure 151; a second area A2 is further arranged on a top surface 171 of the transparent conducting layer 17, thereby the second area A2 is vertically aligned with the first areas A1. In this embodiment, the transparent conducting layer 17 is made of a material selected from a group consisting of ITO, antimony tin oxide (ATO), fluorine doped tin oxide (FTO), aluminum zinc oxide (AZO), gallium zinc oxide (GZO), indium zinc oxide (IZO) and zinc oxide (ZnO), but the present invention is not limited to such application.

Further referring to FIG. 3I, after fabrication of the transparent conducting layer 17, a trench T is fabricated by photolithography to form a boundary for isolation. Then ITO in the trench T is removed by etching liquid.

FIG. 3J and FIG. 3M illustrated the deposition of the first metal electrode 18. An electrode pattern is fabricated by photolithography and then titanium (Ti) and gold (Au) are deposited and removed by lift-off process to form the first metal electrode 18 on the transparent conducting layer 17 with an aperture 181 aligned with the second area A2 of the transparent conducting layer 17 to avoid blocking the first area A1; but the present invention is not limited to such application.

FIG. 3K illustrated the thickness of the substrate 11 is reduced for the bottom surface 112 thereof to be a mirror-like surface.

FIG. 3L illustrated the deposition of nickel (Ni), germanium (Ge) and gold (Au) to fabricate the second metal electrode 19 on the bottom surface 112 of the substrate 11. Then the electrically pumped surface-emitting photonic crystal laser 10A is fabricated after rapid thermal annealing process. Still, the present invention is not limited to such application.

Referring FIG. 3M, an optical detector 20 is arranged at the lateral side of the light guiding tunnel I of the substructure 15, the optical detector 20 includes the substrate 11, the first cladding layer 12, the active layer 13, the second cladding layer 14, the contact layer C, the electric currents confining structure 16, a third metal electrode 201, and a fourth metal electrode 202, and the predetermination of the second cladding layer 14 and the contact layer C does not have plurality of air holes 141, and the electric currents confining structure 16 has a second opening 162 corresponding to the predetermination, the third metal electrode 201 is arranged on the second opening 162 and covering the contact layer C, and the fourth metal electrode 202 is arranged on the bottom surface 112 of the substrate 11. Still, the present invention is not limited to such application.

Figure 5A:
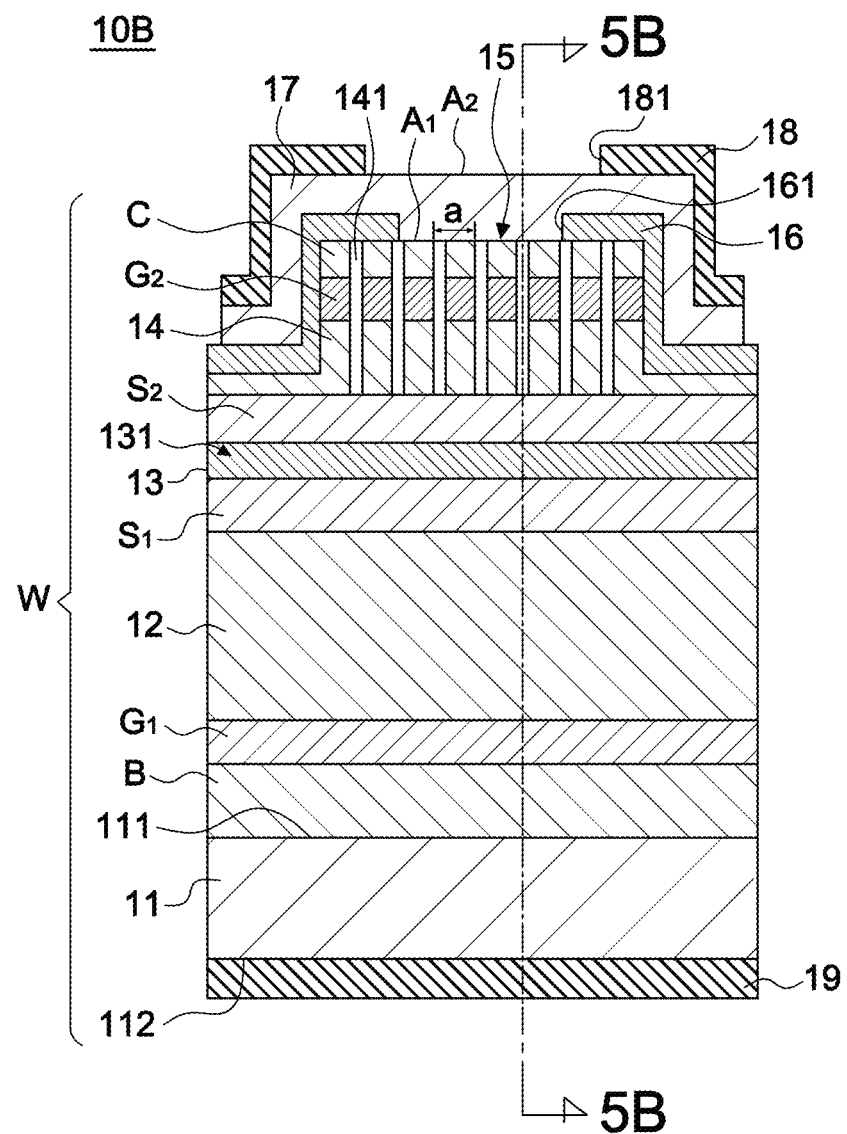
FIG. 5A is a preferred embodiment of the present invention.
Figure 5B:
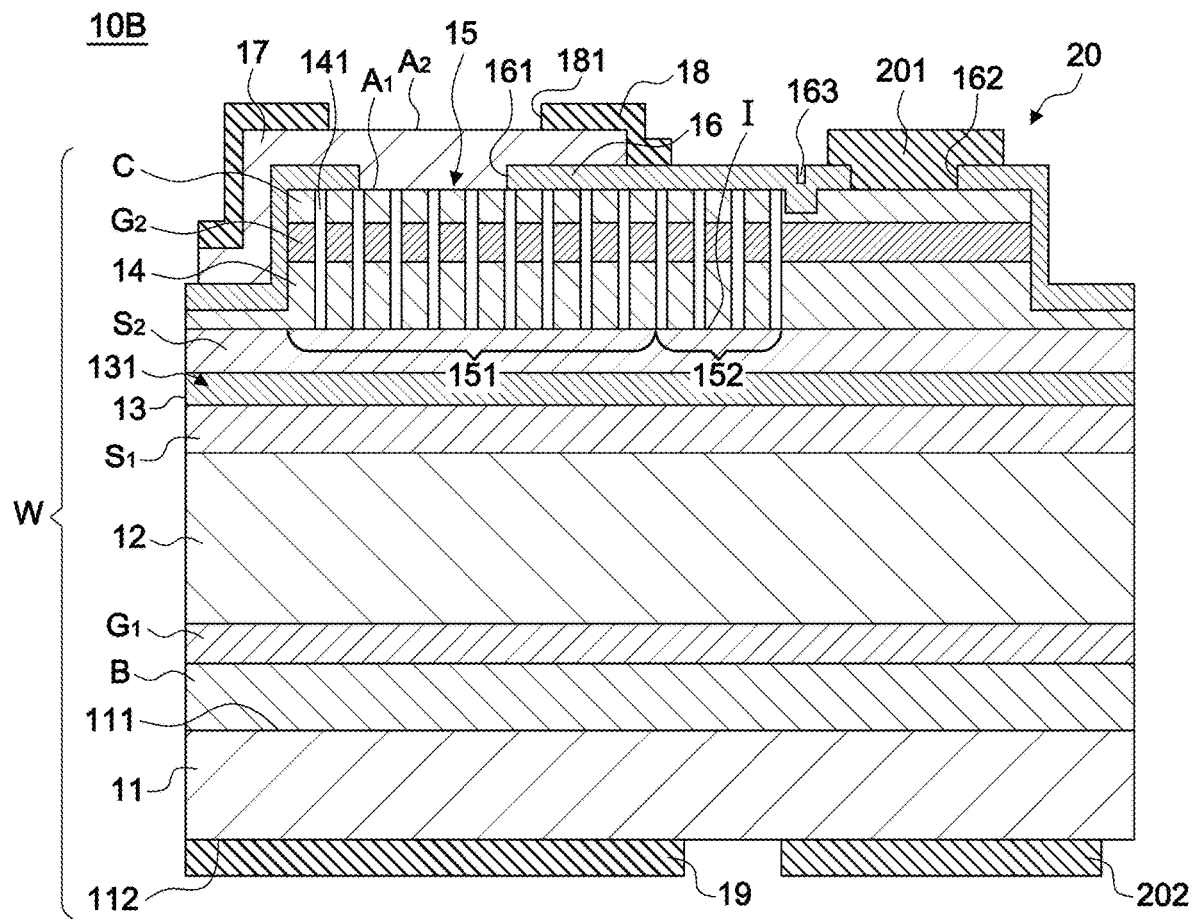
FIG. 5B is a sectional view along line 5B-5B in FIG. 5A.

FIG. 5A and FIG. 5B illustrated an electrically pumped photonic-crystal surface-emitting lasers with optical detector 10B in another embodiment, wherein further comprising a buffer layer B between the substrate 11 and the first cladding layer 12. In this embodiment, the buffer layer B is made of a material selected from a group consisting of GaN, GaAs and InP and has a thickness of 200 nm. Still, the present invention is not limited to such application.

Between the buffer layer B and first cladding layer 12 arranged a first graded-index layer G1, in this embodiment, the first cladding layer 12 is made of AlGaAs and the composition of the chemical formula is $Al_{0.4}Ga_{0.6}As$. The proportion of aluminum is graded from 0.4 to 0.1 for the purpose of alleviation of barriers in-between the GaAs and the AlGaAs. The thickness of the first cladding layer 12 is 1.3 μm and the first graded-index layer G1 is made of a material selected from a group consisting of AlGaAs, GaAs, AlGaN, AlGaInAs and AlGaInP. However, the present invention is not limited to such applications.

A first separate confinement heterostructure S1 is arranged between the first cladding layer 12 and the active layer 13 and a second separate confinement heterostructure S2 is arranged between the active layer 13 and the second cladding layer 14. In this embodiment, the first and second separate confinement heterostructure S1, S2 are made of a material selected from a group consisting of AlGaAs, GaAs, AlGaN, AlGaInAs and AlGaInP. The separate confinement heterostructures have a function of confining carriers and light field during operation. The first separate confinement heterostructure S1 has a thickness of 130 nm and the second separate confinement heterostructure S2 has a thickness of 105 nm. A second graded-index layer G2 is arranged between the second cladding layer 14 and the contact layer C. The second cladding layer 14, the second graded-index layer G2 and the contact layer C are fabricated into a shape of a mesa with a plurality of air holes 141 therein to form the photonic crystal structure 15 having main structure 151 and substructure 152, the top surface 153 of the main structure 151 arranged a light guiding tunnel I at the first areas and the substructure 152. In this embodiment, the second cladding layer 14 is made of AlGaAs and the composition of the chemical formula is $Al_{0.4}Ga_{0.6}As$. The proportion of aluminum is graded from 0.4 to 0.1 for the purpose of alleviation of barriers in-between the GaAs and the AlGaAs. A thickness of the second cladding layer 14 is 200 nm and a thickness of the contact layer C is 100 nm, made of a material selected from a group consisting of AlGaAs, GaAs, AlGaN, AlGaInAs and AlGaInP. However, the present invention is not limited to such applications.

Also, an optical detector 20 is arranged at the lateral side of the light guiding tunnel I of the substructure 152, in this embodiment, the optical detector 20 comprising the substrate 11, the buffer layer B, the first graded-index layer G1, the first cladding layer 12, the first separate confinement heterostructure S1, the active layer 13, the second separate confinement heterostructure S2, the second cladding layer 14, the second graded-index layer G2, the contact layer C, the electric currents confining structure 16, a third metal electrode 201, and a fourth metal electrode 202, and the predetermination of the second cladding layer 14 and the contact layer C does not have plurality of air holes 141, and the electric currents confining structure 16 has a second opening 162 corresponding to the predetermination, the third metal electrode 201 is arranged on the second opening 162 and covering the contact layer C, and the fourth metal electrode 202 is arranged on the bottom surface 112 of the substrate 11. However, the present invention is not limited to such applications.

Also, an epitaxy structure W is therefore fabricated by the substrate 11, the buffer layer B, the first graded-index layer G1, the first cladding layer 12, the first separate confinement heterostructure S1, the active layer 13, the second separate confinement heterostructure S2, the second cladding layer 14 the second graded-index layer G2 and the contact layer C, but the layers of the epitaxy structure W is not limited.

Moreover, the structure above the active layer 13 is a p-type semiconductor with beryllium dopant at an amount of $10^{18}$ $cm^{-3}$ and the contact layer C is heavily doped at an amount of $10^{19}$ $cm^{-3}$ for better ohmic contact with the ITO. The structure under the active layer 13 is an n-type semiconductor with silicon dopant at an amount of $10^{18}$ $cm^{-3}$. The materials fabricating the substrate 11, the buffer layer B, the first graded-index layer G1, the first cladding layer 12, the first separate confinement heterostructure S1, the second separate confinement heterostructure S2, the second cladding layer 14 the second graded-index layer G2 and the contact layer C also allow a wavelength of the laser to include blue and infrared lights.

Figure 6A:
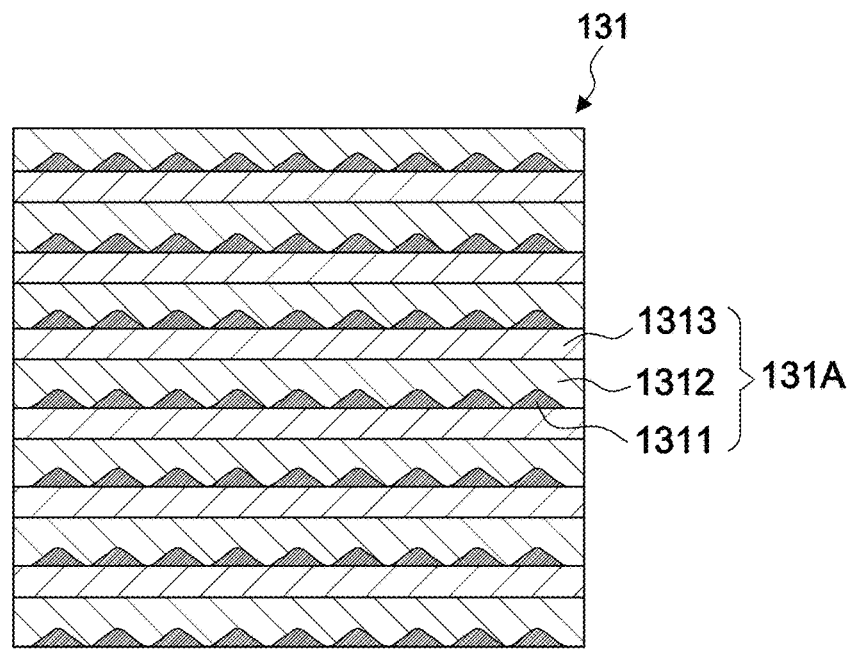
FIG. 6A is a schematic diagram of a quantum structure according to the present invention.

Referring to FIG. 6A, the quantum structure 131 includes at least a layer of quantum dots 131A, in this embodiment, the quantum dots 131A is made of a material selected from a group consisting of indium arsenide phosphide (InAsP), gallium nitride (GaN), indium gallium arsenide (InGaAs), indium gallium nitride (InGaN), indium gallium phosphide (InGaP), aluminum gallium indium arsenide (AlGaInAs), aluminum gallium indium phosphide (AlGaInP) and gallium indium arsenide phosphide (GaInAsP). Also, in this embodiment, the quantum structure 131 has seven layers of quantum dots 131A, each layer having a quantum dot 1311, a cap layer 1312 and a space layer 1313. The quantum dot 1311 is covered by a cap layer 1312 and the cap layer 1312 is cover by the space layer 1313. The quantum dot 1311 is made of 2.2-monolayer InAs; the cap layer 1312 is made of InGaAs with a thickness of 5 nm, and the composition of the chemical formula is $In_{0.15}Ga_{0.85}As$. The space layer 1313 is made of GaAs with a thickness of 45 nm. However, the present invention is not limited to such applications.

Figure 6B:
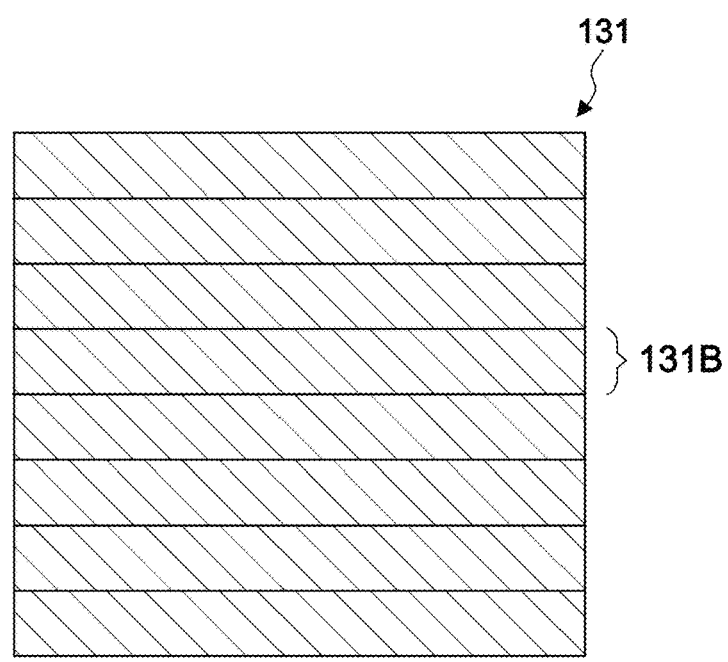
FIG. 6B is a schematic diagram of another quantum structure in the preferred embodiment according to the present invention.

Referring to FIG. 6B, the quantum structure 131 includes at least a layer of quantum well 131B. In this embodiment, the layer of quantum well 131B is made of a material selected from a group consisting of InAsP, GaN, InGaAs, InGaN, InGaP, AlGaInAs, AlGaInP and GaInAsP, but the present invention is not limited to such application.

With structures disclosed above, the present invention has the quantum structure 131 as the gain media to successfully fabricate the electrically pumped surface-emitting photonic crystal laser operable at room temperature. The periodicity a of the plurality of air holes 141 of the main structure 151 is 385 nm, 388 nm, 390 nm, 393 nm or 395 nm, a wavelength of emitted laser beam is around 1.3 μm; in other words, the wavelength of emitted laser beam is variable since the wavelength becomes longer as the periodicity a of the plurality of air holes 141 of the main structure 151 gets longer. On the other hand, the present invention does not require complex techniques of wafer fusion bonding and epitaxial regrowth for fabrication; instead, it has the epitaxy structure W etched from the top for fabrication of the plurality of air holes 141 of the main structure 151 and has ITO applied thereon as the transparent conducting layer 17, so as to enable laser beams to be emitted from a front surface of the epitaxy structure W and to bring features of surface-emission and narrow divergence angle.

Figure 7:
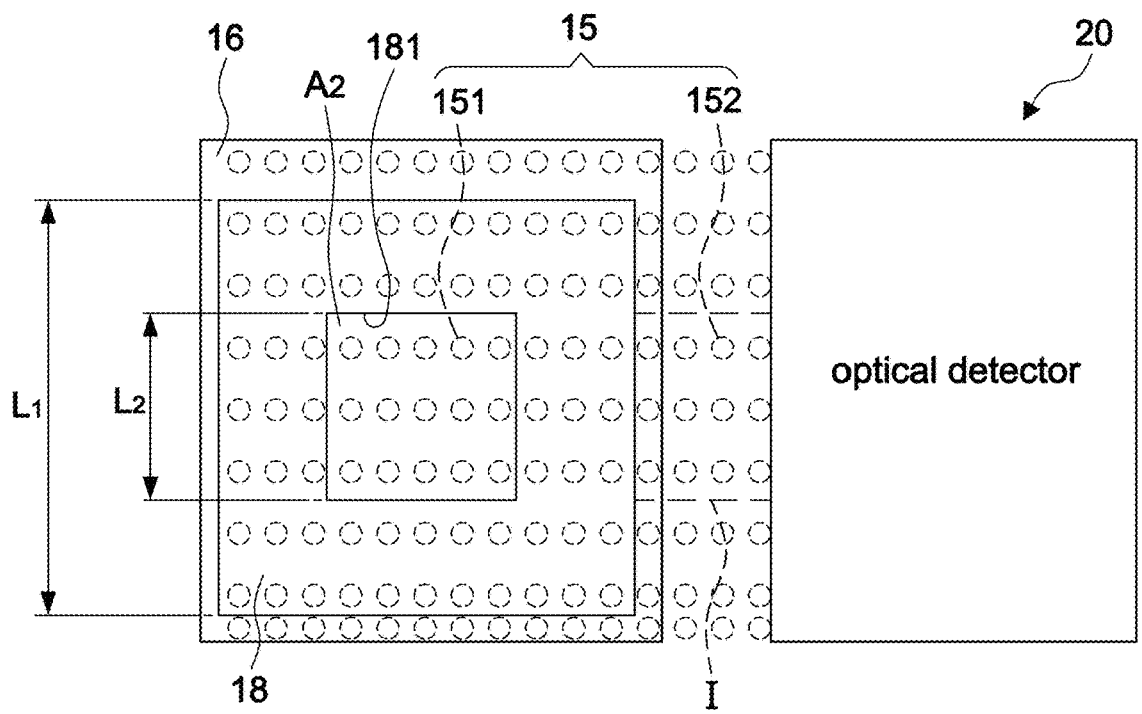
FIG. 7 is a top plan view of the present invention.

The difference between the embodiments 10A and 10B is the materials for growing the epitaxy, but both embodiments have the first metal electrode 18, the transparent conducting layer 17, the electrical currents confinement structure 16 and the second metal electrode 19 operated to electrically pump the quantum structure 131; then the photonic crystal structure 15 surface-emits laser beams to the first areas A1, the first opening 161 of the electric currents confinement structure 16, the second area A2 of the transparent conducting layer 17 and through the aperture 181 of the first metal electrode 18. As shown in FIG. 7, an outer and inner side-length of the square aperture 181 is respectively 650 μm and 300 μm, and the aperture 181 exposes the second area A2 of the transparent conducting layer 17 therein, and the periodicity a, size, shape, depth, diameter, and arrangement of the plurality of air holes 141 of the main structure 151 can be the same or different to the plurality of air holes 141 of the substructure 152, furthermore, the substructure 152 can be formed with plurality of air holes 141 or without air holes 141, in other word, the light guiding tunnel I can be formed with plurality of air holes 141 or without air holes 141.

Figure 8:
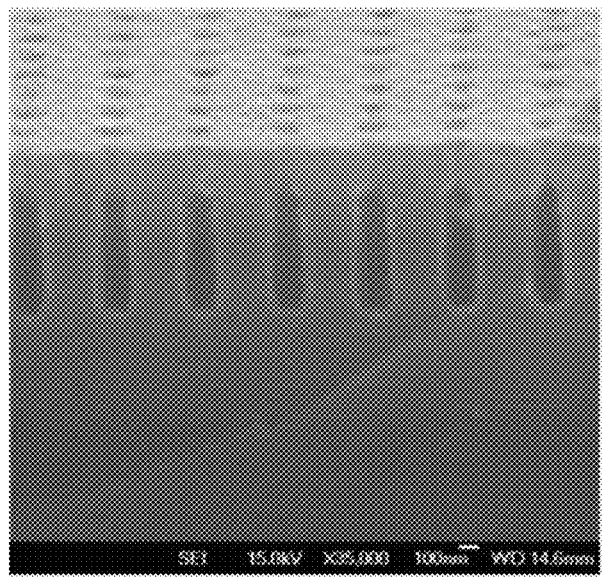
FIG. 8 is a side plan view of fabrication of an electrical current confining structure and transparent conducting layer at the first areas of the main structure under an electron microscope.

The fabrication of the electric currents confinement structure 16 and the transparent conducting layer 17 on the first areas A1 of the main structure 151 as shown in FIG. 8 can be compared with FIGS. 4A and 4B in which they are not fabricated yet to further illustrate the position of the electric currents confinement structure 16 and the transparent conducting layer 17 on the electrically pumped surface-emitting photonic crystal laser 10A, 10B. Also, referring to FIG. 3M and FIG. 5B, the electric currents confinement structure 16 has a current separating trench 163, the current separating trench 163 is arranged between the first opening 161 and second opening 162 for avoiding the current produced by the first metal electrode 18 and second metal electrode 19 flowing to the optical detector 20.

Figure 9:
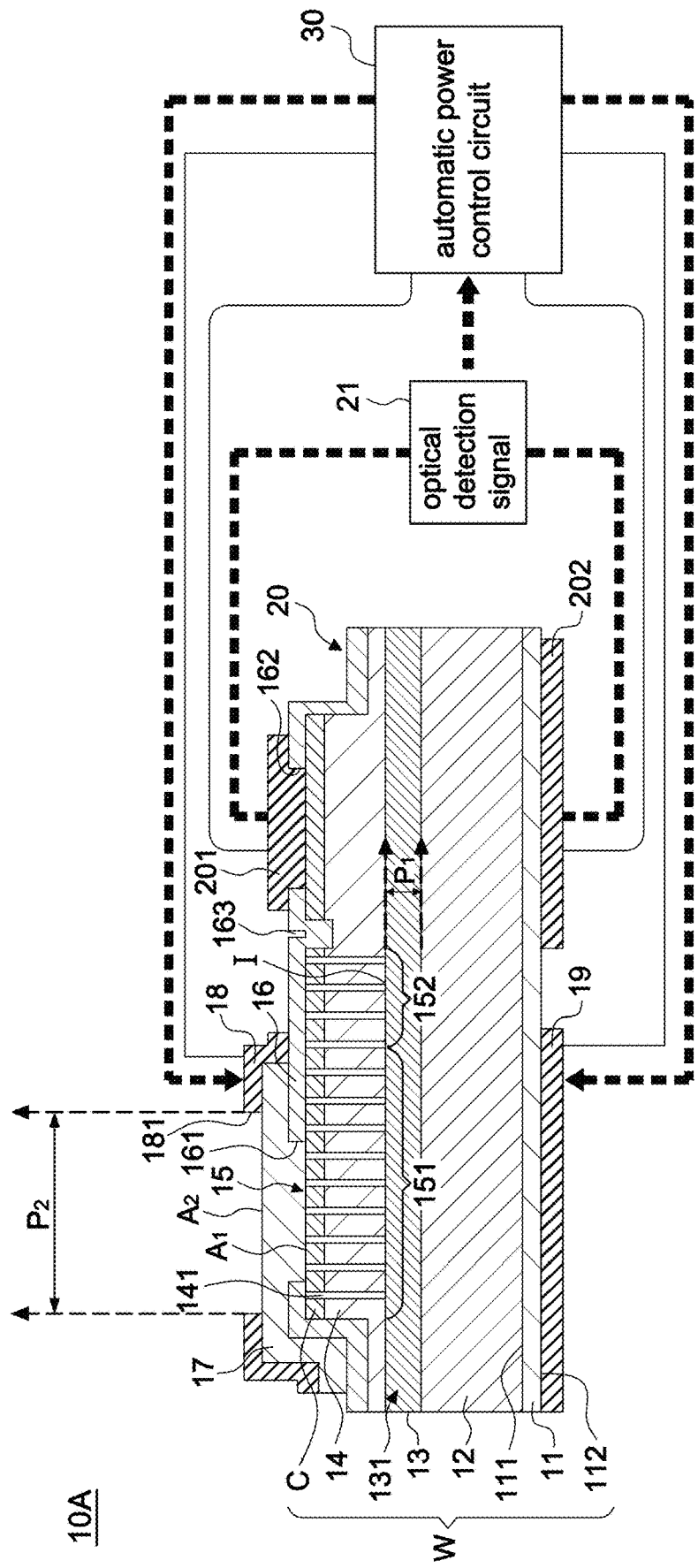
FIG. 9 is a side plan view of the combination of the present invention and automatic power control circuit.
Figure 10:
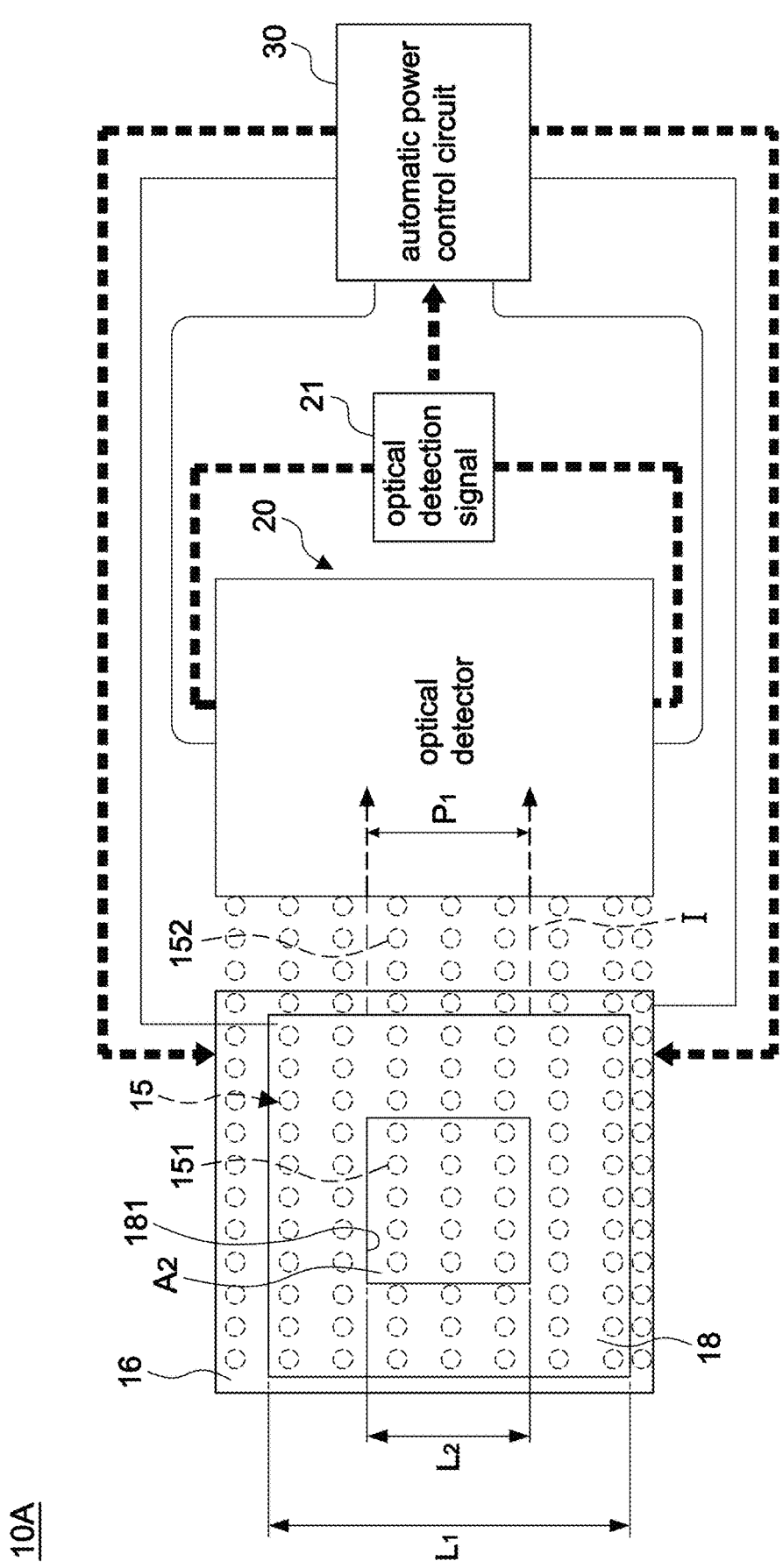
FIG. 10 is a top plan view of the combination of the present invention and automatic power control circuit.

Referring to FIGS. 9-10, using optical detector 20 to integrate an automatic power control circuit 30, the automatic power control circuit 30 electrically connected to the optical detector 20, the first metal electrode 18, and the second metal electrode 19, and the surface-emitting laser emits non surface-emitting laser along the light guiding tunnel I of the substructure 152 to the optical detector 20 in the active layer 13, so the optical detector 20 can detect the light guiding proportion P1 of the laser in the light guiding tunnel I and produce an optical detection signal 21, and using the optical detection signal 21 produced by the optical detector 20, the automatic power control circuit 30 can feedback the power proportion P2 for controlling the surface-emits laser, in this embodiment, the optical detection signal 21 can be bias current and can transmit the optical detection signal 21 by the third metal electrode 201 and fourth metal electrode 202 to the automatic power control circuit 30. However, the present invention is not limited to such applications.

Although particular embodiments of the invention have been described in detail for purposes of illustration, various modifications and enhancements may be made without departing from the spirit and scope of the invention. Accordingly, the invention is not to be limited except as by the appended claims.

What is claimed is:

1. An electrically pumped photonic-crystal surface-emitting lasers with optical detector, comprising:
   a substrate having a top surface and a bottom surface;
   a first cladding layer arranged on the top surface of the substrate;
   an active layer with a quantum structure arranged on the first cladding layer;
   a second cladding layer arranged on the active layer in a shape of a mesa;
   a contact layer arranged on the second cladding layer and including a plurality of air holes, by the variation of position and size proportion of the air holes form a photonic crystal structure having main structure and substructure, and the main structure further having a first area on a top surface of the main structure and having a light guiding tunnel on the substructure;
   an electrical current confining structure arranged on the photonic crystal structure and on the active layer and including an opening corresponding to the first area on the photonic crystal structure, so as to confine the electrical currents within the first area;
   a transparent conducting layer arranged on the electrical currents confining structure and including a second area on a top surface thereof, covering the active layer of the photonic crystal structure and having the second area vertically aligned with the first area;
   a first metal electrode arranged on the transparent conducting layer with an aperture aligned with the second area of the transparent conducting layer to avoid blocking the first area;
   a second metal electrode arranged under the bottom surface of the substrate; and
   an optical detector arranged by the side of the light guiding tunnel of the substructure;
   whereby the first metal electrode, the transparent conducting layer, the electrical currents confining structure and the second metal electrode are arranged correspondingly for electrically pumping the quantum structure, and then the photonic crystal structure surface-emits laser through the first area of the main structure, the first opening of the electrical currents confining structure and the second area of the transparent conducting layer to the aperture of the first metal electrode, and the surface-emitting laser emits non surface-emitting laser along the light guiding tunnel of the substructure to the optical detector in the active layer, so the optical detector can detect the light guiding proportion of the laser in the light guiding tunnel and produce an optical detection signal.

2. The electrically pumped photonic-crystal surface-emitting lasers with optical detector as claimed in claim 1, further comprises an automatic power control circuit electrically connected to the optical detector, the first metal electrode, and the second metal electrode, and using the optical detection signal produced by the optical detector, the automatic power control circuit can feedback the power proportion for controlling the surface-emitting laser.

3. The electrically pumped photonic-crystal surface-emitting lasers with optical detector as claimed in claim 1, wherein the optical detector includes the substrate, the first cladding layer, the active layer, the second cladding layer, the contact layer, the electric currents confining structure, a third metal electrode, and a fourth metal electrode, and the predetermination of the second cladding layer and the contact layer does not have plurality of air holes, and the electric currents confining structure has a second opening corresponding to the predetermination, the third metal electrode is arranged on the second opening and covering the contact layer, and the fourth metal electrode is arranged on the bottom surface of the substrate.

4. The electrically pumped photonic-crystal surface-emitting lasers with optical detector as claimed in claim 1, wherein the second cladding layer has a thickness between 10 to 500 nm.

5. The electrically pumped photonic-crystal surface-emitting lasers with optical detector as claimed in claim 1, wherein the electrical currents confirming structure is made of a material selected from a group consisting of silicon nitride (SiNx), silicon oxide (SiOx) and polyimide.

6. The electrically pumped photonic-crystal surface-emitting lasers with optical detector as claimed in claim 1, wherein the transparent conducting layer is made of a material selected from a group consisting of indium tin oxide (ITO), antimony tin oxide (ATO), fluorine doped tin oxide (FTO), aluminum zinc oxide (AZO), gallium zinc oxide (GZO), indium zinc oxide (IZO) and zinc oxide ZnO.

7. The electrically pumped photonic-crystal surface-emitting lasers with optical detector as claimed in claim 1, wherein the quantum structure includes at least a layer of quantum dots.

8. The electrically pumped photonic-crystal surface-emitting lasers with optical detector as claimed in claim 7, wherein the layer of quantum dots is made of a material selected from a group consisting of indium arsenide phosphide (InAsP), gallium nitride (GaN), indium gallium arsenide (InGaAs), indium gallium nitride (InGaN), indium gallium phosphide (InGaP), aluminum gallium indium arsenide (AlGaInAs), aluminum gallium indium phosphide (AlGaInP) and gallium indium arsenide phosphide (GaInAsP).

9. The electrically pumped photonic-crystal surface-emitting lasers with optical detector as claimed in claim 1, wherein the quantum structure includes at least a layer of quantum well.

10. The electrically pumped photonic-crystal surface-emitting lasers with optical detector as claimed in claim 9, wherein the layer of quantum well is made of a material selected from a group consisting of indium arsenide phosphide (InAsP), gallium nitride (GaN), indium gallium arsenide (InGaAs), indium gallium nitride (InGaN), indium gallium phosphide (InGaP), aluminum gallium indium arsenide (AlGaInAs), aluminum gallium indium phosphide (AlGaInP) and gallium indium arsenide phosphide (GaInAsP).

11. The electrically pumped photonic-crystal surface-emitting lasers with optical detector as claimed in claim 1, further comprising a buffer layer between the substrate and the first cladding layer.

12. The electrically pumped photonic-crystal surface-emitting lasers with optical detector as claimed in claim 11, further comprising a first graded-index layer between the buffer layer and the first cladding layer.

13. The electrically pumped photonic-crystal surface-emitting lasers with optical detector as claimed in claim 1, further comprising a first separate confinement heterostructure between the first cladding layer and the active layer and a second separate confinement hetero structure between the active layer and the second cladding layer.

14. The electrically pumped photonic-crystal surface-emitting lasers with optical detector as claimed in claim 1, further comprising a second graded-index layer between the second cladding layer and the contact layer.

* * * * *